(12) United States Patent
Bauer et al.

(10) Patent No.: US 8,947,887 B2
(45) Date of Patent: Feb. 3, 2015

(54) PACKAGE ASSEMBLY AND METHOD OF TUNING A NATURAL RESONANT FREQUENCY OF A PACKAGE

(75) Inventors: Robert Bauer, Ismaning (DE); Thorsten Hauck, Freising (DE)

(73) Assignee: Freescale Semiconductor, Inc., Austin, TX (US)

( * ) Notice: Subject to any disclaimer, the term of this patent is extended or adjusted under 35 U.S.C. 154(b) by 659 days.

(21) Appl. No.: 13/142,857

(22) PCT Filed: Feb. 23, 2009

(86) PCT No.: PCT/IB2009/050724
§ 371 (c)(1),
(2), (4) Date: Jun. 30, 2011

(87) PCT Pub. No.: WO2010/095006
PCT Pub. Date: Aug. 26, 2010

(65) Prior Publication Data
US 2012/0026716 A1  Feb. 2, 2012

(51) Int. Cl.
*H05K 1/18* (2006.01)
*H01L 23/495* (2006.01)

(52) U.S. Cl.
CPC ........ *H01L 23/49541* (2013.01); *H01L 23/495* (2013.01); *H01L 23/49548* (2013.01); *H01L 2924/0002* (2013.01)
USPC ........... 361/764; 361/760; 361/763; 361/772; 361/774; 361/782

(58) Field of Classification Search
USPC ................. 361/760–764, 772–774, 782–784; 257/685–686, 787–790
See application file for complete search history.

(56) References Cited

U.S. PATENT DOCUMENTS

| | | | |
|---|---|---|---|
| 5,490,041 A * | 2/1996 | Furukawa et al. | 361/777 |
| 5,644,081 A | 7/1997 | Schwarz et al. | |
| 5,659,950 A | 8/1997 | Adams et al. | |
| 5,877,548 A * | 3/1999 | Washida et al. | 257/690 |
| 5,889,658 A | 3/1999 | Sullivan et al. | |
| 6,582,238 B2 * | 6/2003 | Unou et al. | 439/68 |
| 6,853,063 B2 * | 2/2005 | Akiyama et al. | 257/685 |
| 2003/0075796 A1 | 4/2003 | Hata et al. | |

FOREIGN PATENT DOCUMENTS

| | | |
|---|---|---|
| JP | 05-326796 A | 12/1993 |
| JP | 07-153889 A | 6/1995 |
| JP | 2001-203226 A | 7/2001 |

OTHER PUBLICATIONS

Infineon: "SCT595 Packaging" Infineon Technologies AG, web address download: https://www.infineon.com/cms/packages/SMD_-_Surface_Mounted_Devices/SCx_SCDx_SCT/SCT595.html?_locale=en, 1999-2011, pp. 1-4.
Infineon: "SOT223 Packaging" Infineon Technologies AG, web address download: http://www.infineon.com/cms/packages/SMD_-_Surface_Mounted_Devices/SOT/SOT223_xSC73x.html?_locale=en, 1999-2011, pp. 1-4.
International Search Report and Written Opinion correlating to PCT/IB2009/050724 dated Nov. 19, 2009.

\* cited by examiner

*Primary Examiner* — Tuan T Dinh (57) ABSTRACT

A package assembly comprises an electronic device; a package body; at least a first plurality of leads having a first geometrical shape and a second plurality of leads having a second geometrical shape, protruding from the package body; each of the first plurality of leads being located in corners of the package body; or the first and the second plurality of leads arranged in at least a first row and a second row located in parallel to the first row; each of the rows comprising at least two leads; the first row being transformable into the second row by mirroring the first row along a symmetry plane of the package body; each of the first plurality of leads having the first geometrical shape different from the second geometrical shape.

13 Claims, 10 Drawing Sheets

PACKAGE ASSEMBLY AND METHOD OF TUNING A NATURAL RESONANT FREQUENCY OF A PACKAGE

FIELD OF THE INVENTION

This invention in general relates to packages for electronic devices and more specifically to a package assembly and a method of tuning a natural resonant frequency of a package.

BACKGROUND OF THE INVENTION

Packages for electronic devices are used to house a wide variety of electronic devices. Typically, these packages are semiconductor packages mounted onto a printed circuit board (PCB). Several schemes of mounting a device onto a PCB are available. For example, surface-mount technology (SMT) is an approach of mounting electronic device packages directly onto the PCB surface, whereas through-hole technology refers to a mounting scheme used for pin-through-hole (PTH) electronic device packages that involves the usage of pins on the components that are inserted into holes drilled in the PCB and soldered to pads on the opposite side.

A package has a natural resonant frequency depending on its mechanical properties, i.e. the package has a tendency to oscillate at maximum amplitude at certain resonant frequencies. At these frequencies, even small periodic driving forces can produce large amplitude vibrations, because the package stores vibration energy. For example, a semiconductor package may incorporate sensor elements, e.g. inertial sensor elements such as accelerometers or angular rate sensors, which may be used in automotive applications. In case of an operating frequency of a transducer sensor element close to the natural resonant frequency of the package assembly, the sensor assembly may malfunction or fail, because the sensor transducer element may be stressed, distorted or even damaged.

U.S. Pat. No. 5,889,658 shows a package assembly for encapsulating and vertically surface mounting a semiconductor device using a single row of leads. Instead of using a standard lead shape and a standard pitch, the lead shape can be modified for adjustment of the resonant frequency of the package by varying an external lead offset.

U.S. Pat. No. 5,644,081 shows a through-hole mounted microaccelerometer package with a free formed lead frame that enhances the rigidity of the package and reduces excess vibration in the accelerometer.

U.S. Pat. No. 5,659,950 describes a method of forming a package assembly that encapsulates an electronic die. A single inline package is provided with one row of leads protruding from one side of the package and two additional supports connected to a different side for improving the rigidity and natural bending frequency of the shown package assembly.

SUMMARY OF THE INVENTION

The present invention provides a package assembly, a sensor system and a method of tuning a natural resonant frequency of a package as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Identical reference numerals in different figures refer to identical or similar components.

DETAILED DESCRIPTION OF THE PREFERRED EMBODIMENTS

The preferred embodiments will be described in comparison to example prior art package assemblies.

Figure 1:
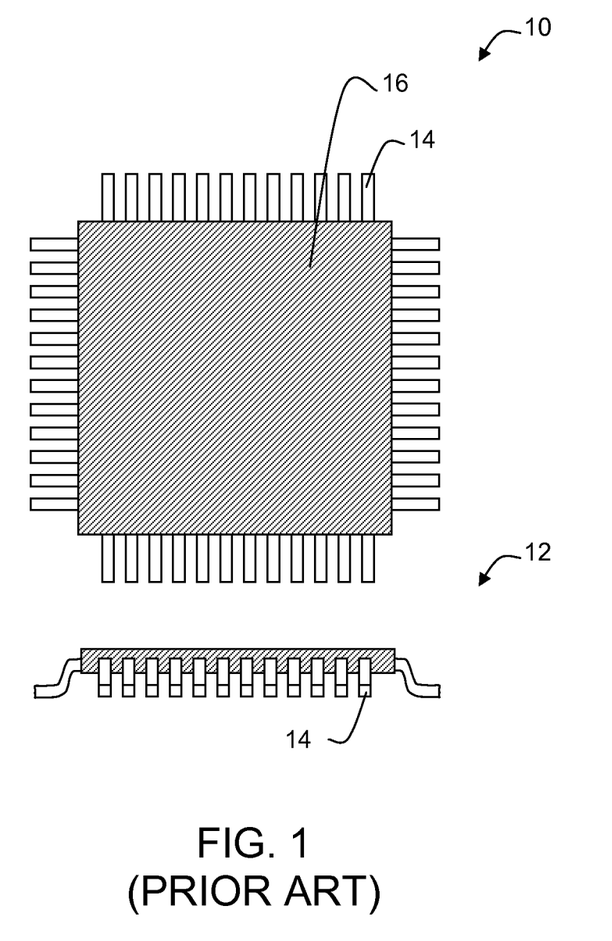
FIG. 1 shows a schematic diagram of top view and side view of a prior art standard quad-flat package assembly.

Referring to FIG. 1, a schematic diagram of top view 10 and side view 12 of a prior art standard quad-flat package (QFP) assembly is shown. A QFP is an integrated circuit package with leads 14 extending from each of the four sides of the package body 16. A lead 14 may be used for connecting the package to a device carrier such as a PCB. A lead may for example be a pin. A QFP is used primarily for surface mounted devices (SMD). In the shown example, gull-wing leads are used for connecting the package assembly to a PCB (not shown).

Figure 2:
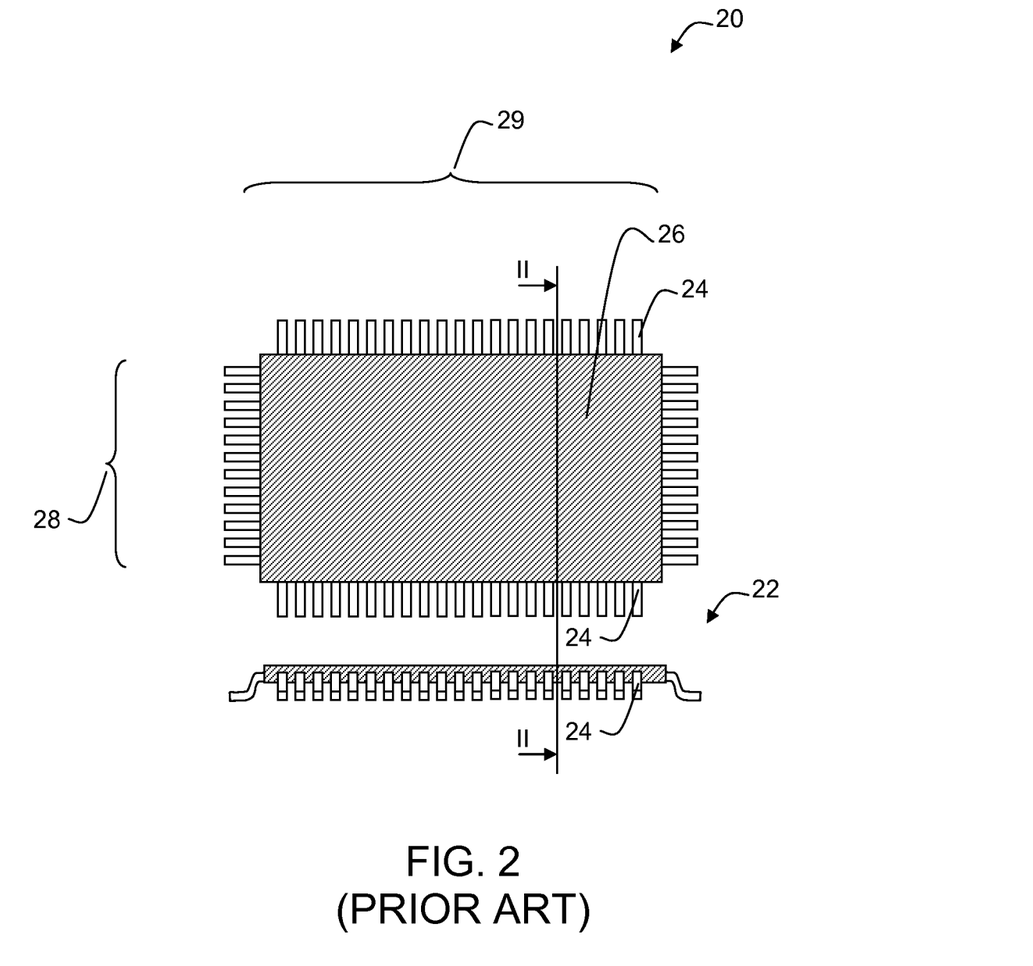
FIG. 2 shows a schematic diagram of top view and side view of a prior art standard small-outline package assembly.

Referring now to FIG. 2, a schematic diagram of top view 20 and side view 22 of a prior art standard small-outline package assembly is shown, having a short side 28 and a long side 29. A small-outline integrated circuit package is a surface-mounted integrated circuit package. In the shown example, gull-wing leads 24 protruding from the package body 26 are used for connecting the package assembly to a PCB (not shown).

Figure 3:
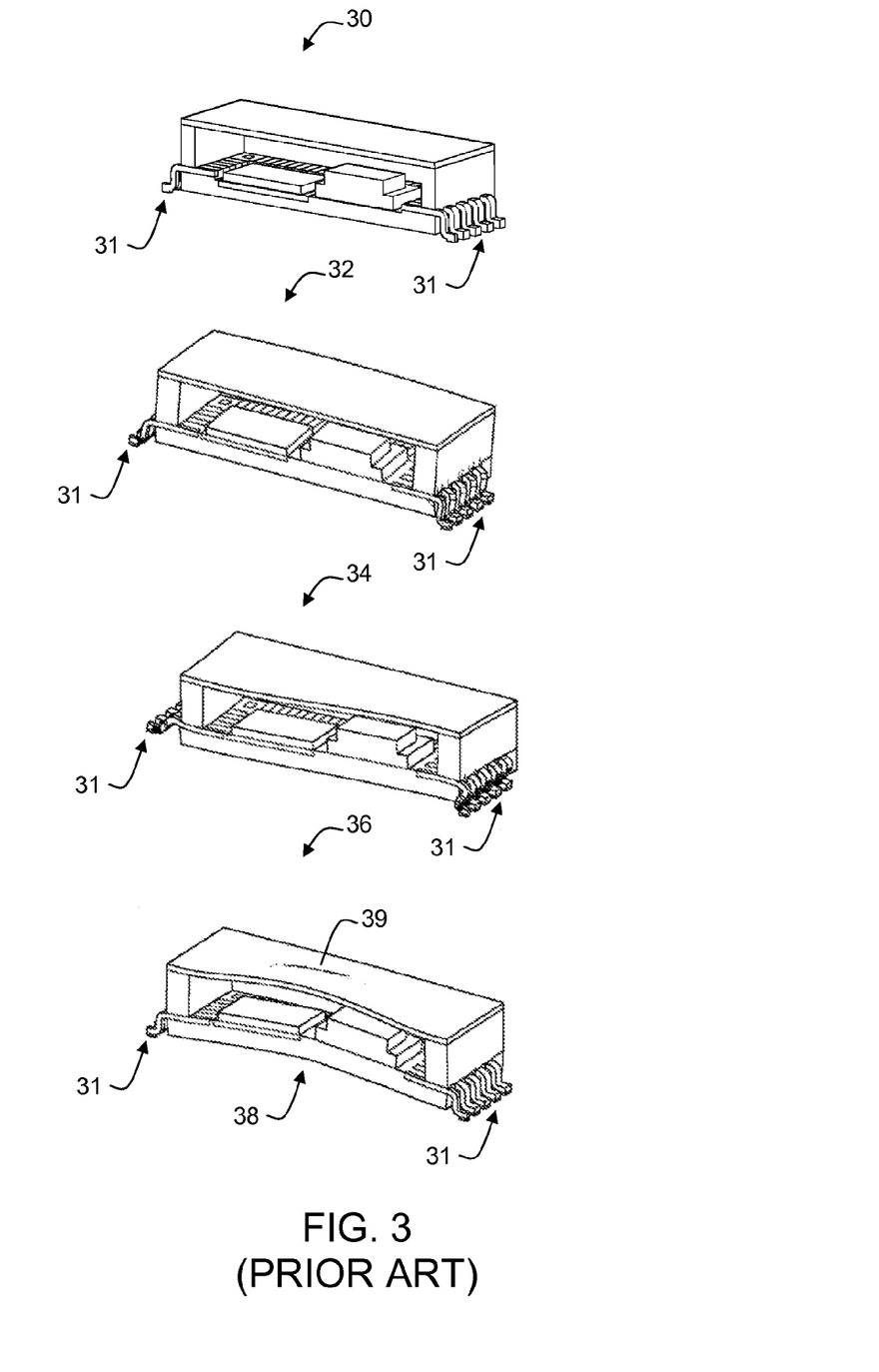
FIG. 3 shows a schematic diagram of a three-dimensional representation of a cross-sectional view of the assembly of FIG. 2 taken along line II-II in FIG. 2, at different resonance modes.

Referring now to FIG. 3, a schematic diagram of a three-dimensional representation of a cross-sectional view of the assembly of FIG. 2 taken along line II-II in FIG. 2, at different resonant modes is shown.

The first part 30 of the diagram shown in FIG. 3 provides a cross-sectional view of the package assembly without being subject to vibration close to a resonant frequency of the package body. The shown example package assembly may have a pitch of 0.8 mm, a lead width of 0.4 mm and the package body may be a liquid crystal polymer plastic body. However, it should be noted that a package having other typical geometrical layout parameter values may have been chosen instead; and the package body may be formed from other base materials. The shown package encapsulates two electronic circuits and may be free from any distortion due to vibration energy received.

The second part 32 of the diagram shows the same view, but with the package assembly being stressed due to receiving a stimulation close to a first resonant mode (or resonant frequency) of the shown example package body. This may for example be about 18.3 kHz (for example at about 125° C.), which may be a rocking mode of the housing, i.e. the package body, especially due to side bending of the short side leads (not shown). In the shown example, the shown long side leads 31 are also bended.

The third part 34 of the diagram shown in FIG. 3 again shows the same fraction of the package body, now at a second resonant mode, which may be about 20 kHz for the shown example, distorting the package and bending especially the long side leads 31.

The fourth part 36 of the diagram shown in FIG. 3 shows the assembly fraction at a third resonant mode of the package body, which may be about 21 kHz with the chosen example geometrical parameters as described above. This resonance mode of the package body may especially cause stress to bottom 38 and top 39 of the package body. However, the third resonant mode may stress short side leads and long side leads 31 less than other resonant modes since for example stress may be more equally distributed between leads.

Referring now also to FIG. 4-8, example embodiments of a package assembly 40, 60, 70, 80 are provided and described in comparison to the example standard package assemblies shown in FIG. 1, FIG. 2 and FIG. 3. The package assembly may comprise an electronic device 106, 108; a package body 46, 66, 76, 86; at least a first plurality of leads 44, 64, 74, 84 having a first geometrical shape and a second plurality of leads 48, 68, 78, 88 having a second geometrical shape, protruding from the package body. Each of the first plurality of leads may either be located in corners of the package body; or the first and the second plurality of leads may be arranged in at least a first row 50 and a second row 52 located in parallel to the first row; each of the rows comprising at least two leads. The first row may transformable into the second row by mirroring the first row along a symmetry plane 54 of the package body and each of the first plurality of leads may have the first geometrical shape different from the second geometrical shape.

The package assembly may therefore have a natural resonant frequency shifted, e.g. increased, compared to a natural frequency of another package assembly being identical to the described package assembly, but neither having the first geometrical shape different from the second geometrical shape nor having the first plurality of leads located in corners of the other package body.

Each of a plurality of leads may have the same shape, at least before first application of vibration energy to the package assembly, which may for example be bend leads.

The first plurality of leads 44, 64, 74, 84 may be placed in the corners of the package or may be placed in rows together with the second plurality of leads having different shapes as described above. However it should be noted that this may also include that leads of the first plurality of leads may have a different shape and at the same time may also be placed in the package corners.

Figure 8:
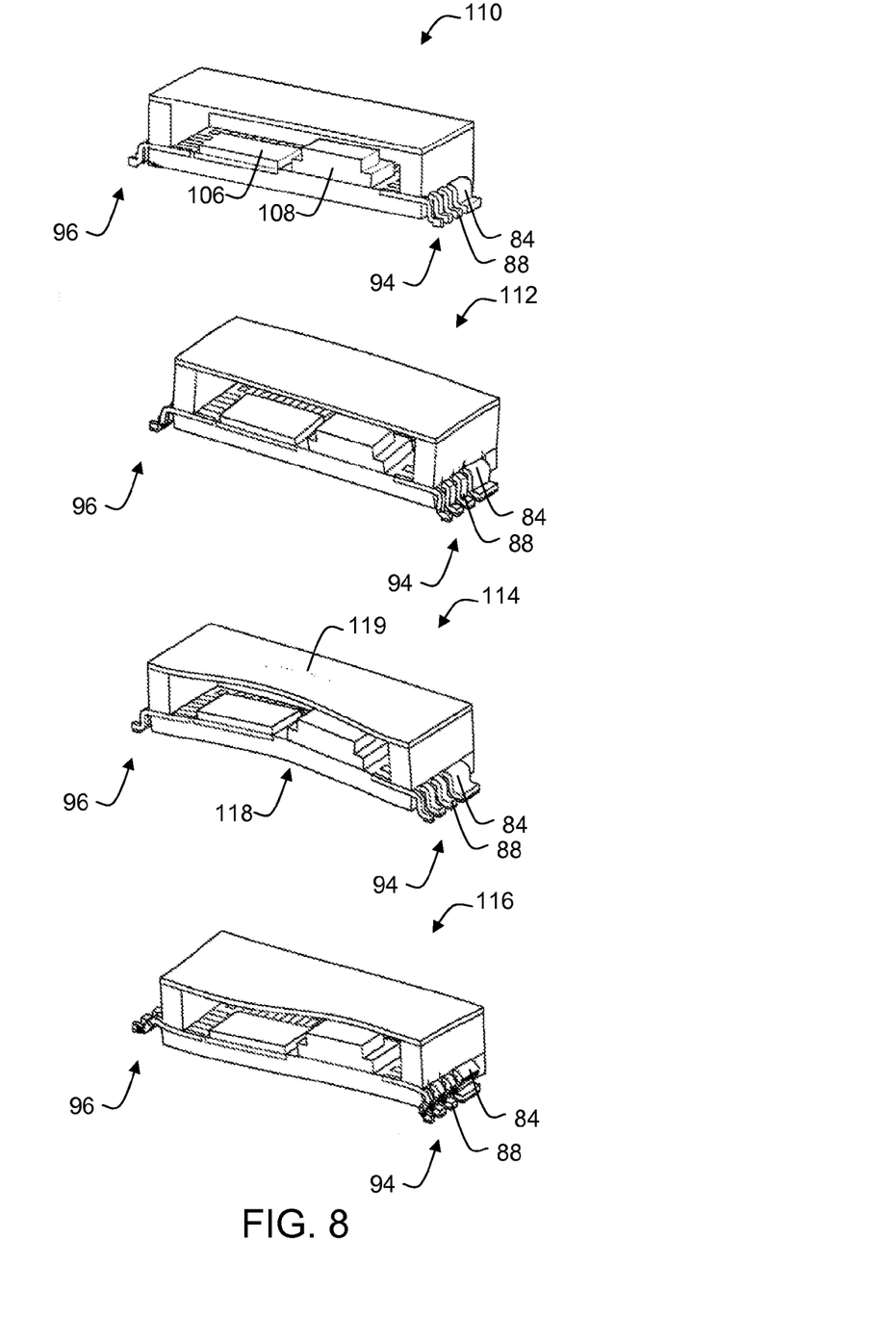
FIG. 8 shows a schematic diagram of a three-dimensional representation of a cross-sectional view of the example of FIG. 7 taken along line II-II in FIG. 7, at different resonance modes.

The electronic device 106, 108 may be a semiconductor device. However, the electronic device may be any device comprising one or more electronic and/or electro/mechanical components, e.g. micro electro mechanical systems (MEMS). For example, a sensor may be a semiconductor device. And it may for example also comprise mechanical components.

Figure 4:
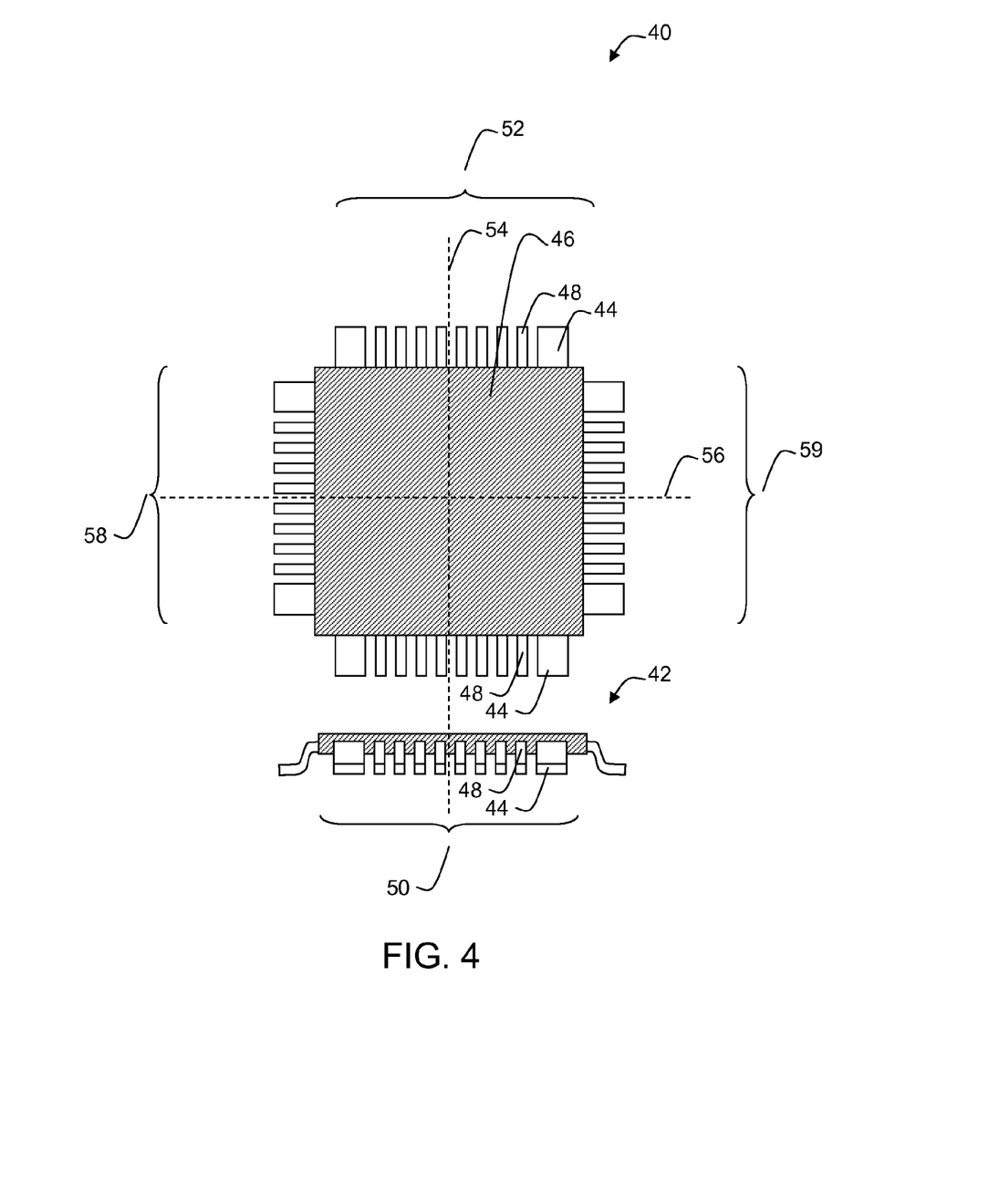
FIG. 4 shows a schematic diagram of top view and side view of an example of a first embodiment of a package assembly.

FIG. 4 shows a schematic diagram of top view 40 and side view 42 of an example of a first embodiment of a package assembly. The shown assembly may be based on a modification of a standard quad-flat package, as shown in FIG. 1. The package assembly shown in FIG. 4 comprises a first 44 and a second plurality of leads 48 having different shapes. The leads are grouped in four rows 50, 52 58, 59, one on each side of the package, being symmetrical according to symmetry planes 54, 56 of the package body. The first row 50 may be transformable into the second row 52 by mirroring the first row along symmetry plane 56 and the third row 58 may be transformable into the fourth row 59 by mirroring the third row along symmetry plane 54.

For tuning a natural resonant frequency of the package, the shape, position and number of lead pairs may be chosen depending on a targeted resonant frequency. The selection of the targeted frequency may depend on an operation frequency of the electronic device. The shown embodiment provides two leads 44 per row having a shape different from the standard shape of the other leads 48. For the first embodiment, these differently shaped leads are provided aligned with the other leads but close to the corners of the package.

The geometrical shape of the first plurality of leads 44 may be different from the geometrical shape of the second plurality of leads 48, which may have a standard lead shape, for example according to standards defined by JEDEC Solid State Technology Association. The first plurality of leads shape may differ from the second plurality for example in width and/or depth and/or height or length.

The term "geometrical shape" of a lead may refer to its three-dimensional appearance. A first geometrical shape may therefore be different from a second geometrical shape when its appearance is different in at least one of the three spatial dimensions.

The first geometrical shape of the first plurality of leads 44 may differ from the second geometrical shape only in one of three spatial directions being orthogonal to each other. This may for example be beneficial for design and enhanced compatibility with available applications and manufacturing based on available sources.

For example, a width of each of the first plurality of leads 44 may differ from a width of each of the second plurality of leads 48. The width of each of the first plurality of leads 44 may for example be chosen greater than those of the second plurality of leads 48, forming "ribbon leads". This may enhance lead stiffness and rigidity of the package assembly and increase the targeted natural resonance frequency.

The width of each of the first plurality 44 may for example be a sum of n times the width of one of the second plurality of leads 48, plus (n−1) times a pitch between two neighbouring leads of the second plurality of leads, n being an integer number. By "melting" neighbouring leads into a new lead having a greater width, only very few changes compared to a standard layout may be required while allowing for selective tuning of the package rigidity and therefore increasing its resonant frequency. Ribbon leads may be created by merging neighbouring single leads. With this approach, standard materials, packaging techniques and assembly processes may still be used.

Figure 5:
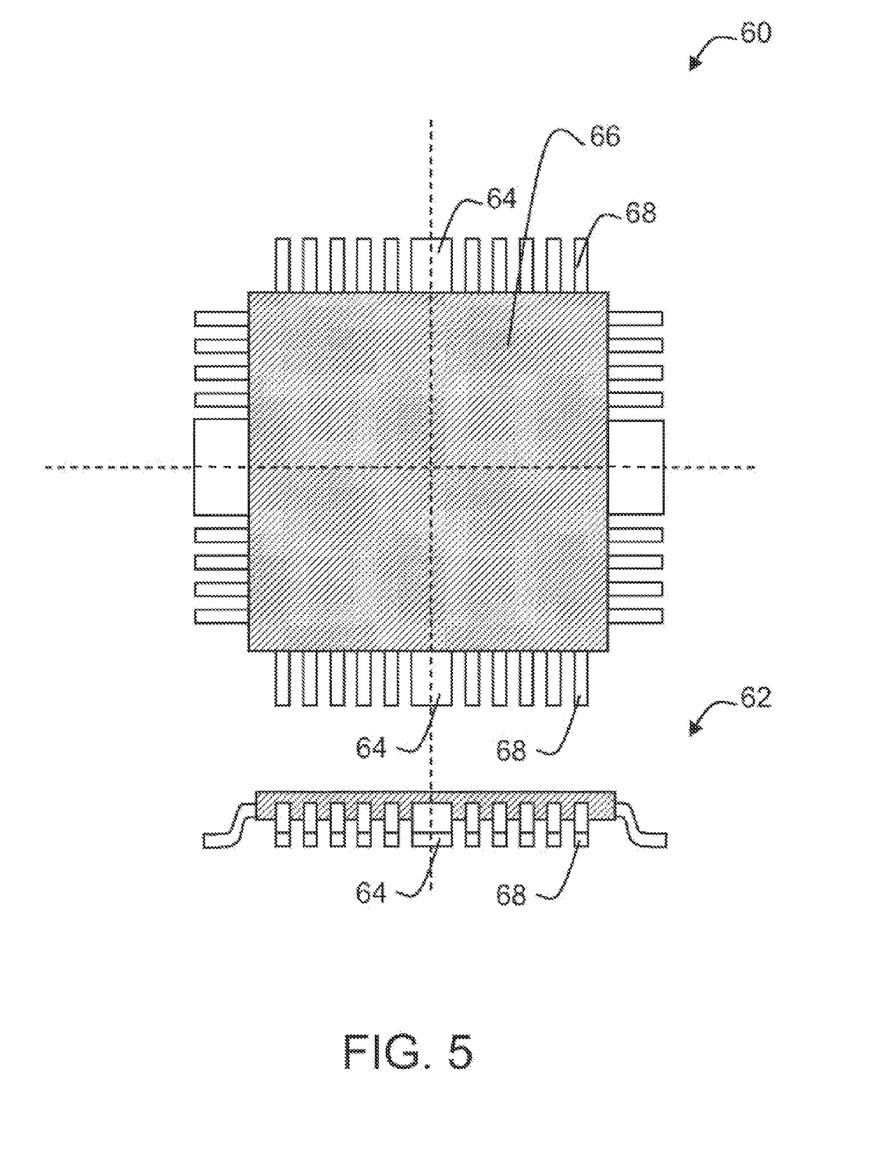
FIG. 5 shows a schematic diagram of top view and side view of an example of a second embodiment of a package assembly.

FIG. 5 shows a schematic diagram of top view 60 and side view 62 of an example of a second embodiment of a package assembly. Only components different from the first embodiment shown in FIG. 4 will be described. A first plurality of leads 64, i.e. the "ribbon leads", may be located in the center of each row, allowing for a different shift of the package resonant frequency while keeping a balanced resonance behaviour of the package body 66.

Apart from position and shape of the first plurality of leads 64 in comparison to the second plurality 68, resonant frequency fine tuning may be achieved by applying more than two types of leads. Therefore, the package assembly may comprise a third plurality of leads having a third geometrical shape different from the first geometrical shape and the second geometrical shape. However, more than three types of leads may be used.

Figure 6:
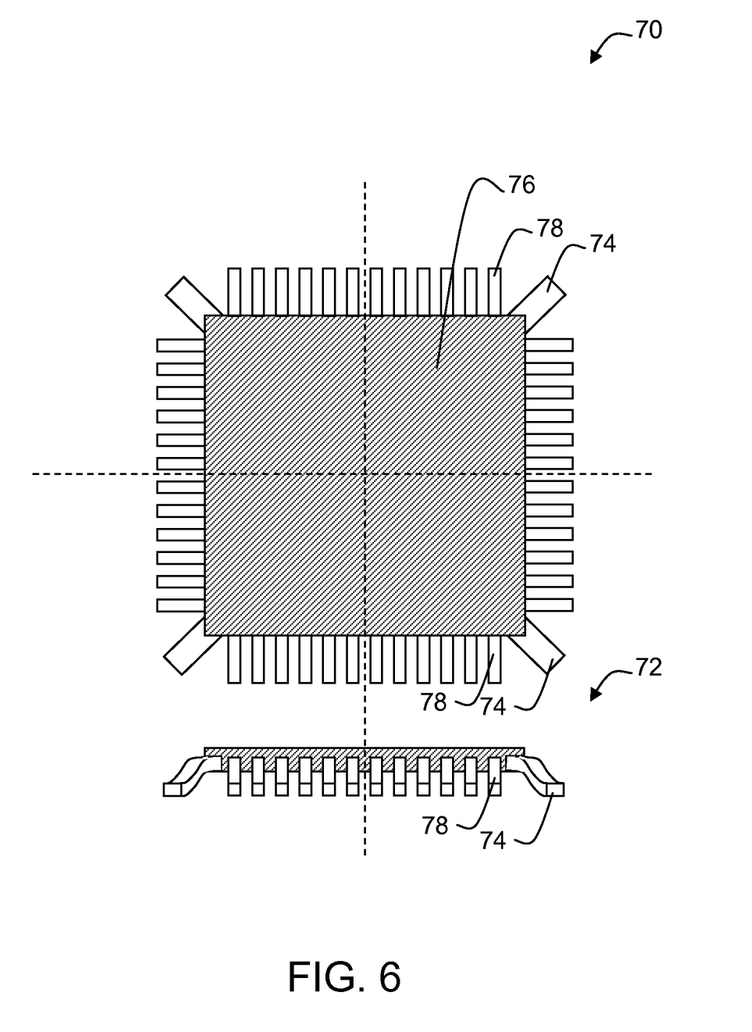
FIG. 6 shows a schematic diagram of top view and side view of an example of a third embodiment of a package assembly.

FIG. 6 shows a schematic diagram of top view 70 and side view 72 of an example of a third embodiment of a package assembly. Again, only components different from the first embodiment shown in FIG. 4 will be described. As shown, a first plurality of leads 74 may be placed in the corners of the package body 76, for enhanced rigidity of the package while allowing for an unchanged device layout with respect to other leads 78. As an example, FIG. 6 illustrates that each of the first plurality of leads 74 may be connected to corners of said package body and may have the first geometrical shape different from the second geometrical shape. Hence, leads 74 may not only be placed in corners of the package, but may also be implemented as ribbon leads.

Figure 7:
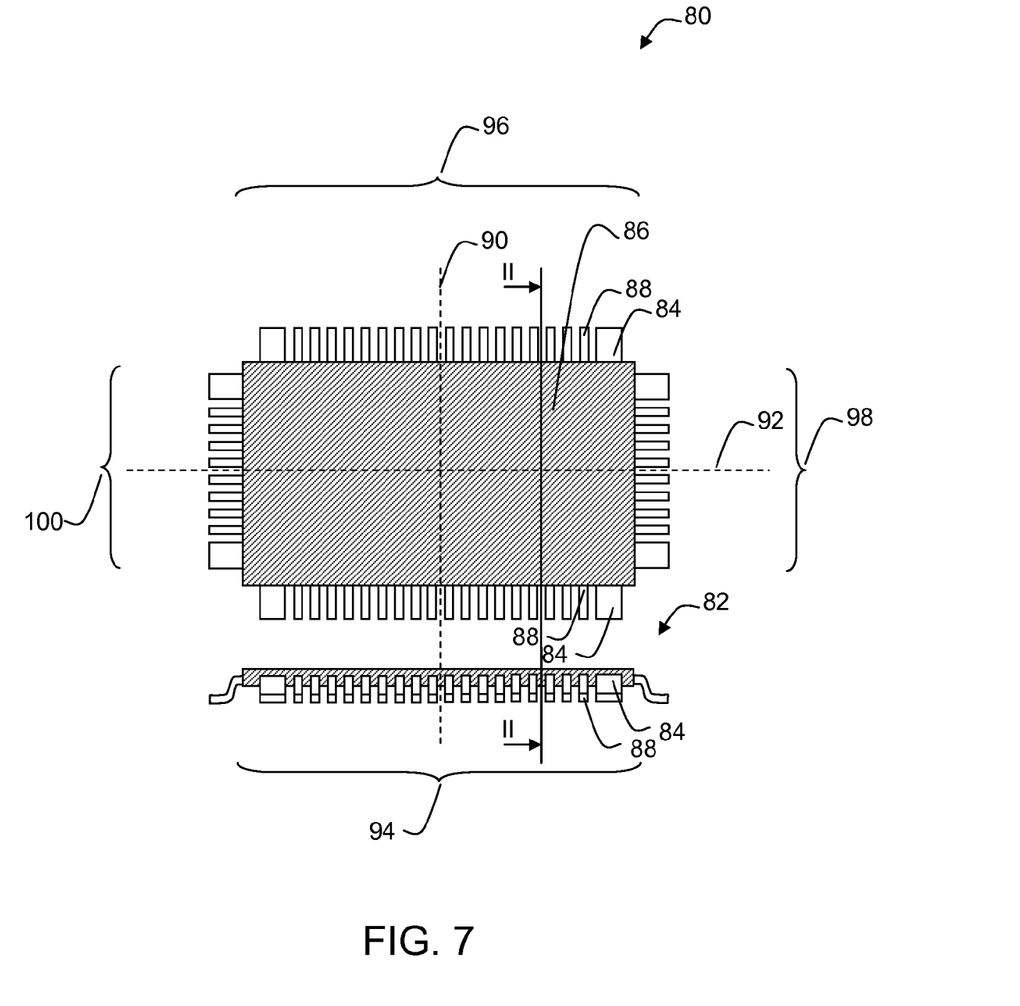
FIG. 7 shows a schematic diagram of top view and side view of an example of a fourth embodiment of a package assembly.

FIG. 7 shows a schematic diagram of top view 80 and side view 82 of an example of a fourth embodiment of a package assembly. Again, only components different from the first embodiment shown in FIG. 4 will be described. The shown fourth embodiment illustrates a modified small-outline package assembly that may be compared to the standard small-outline package assembly provided in FIG. 2. Similar to the first embodiment shown in FIG. 4, the package assembly shown in FIG. 7 comprises a first 84 and a second plurality of leads 88 having different shapes. The leads are grouped in four rows 94, 96, 98, 100, one on each side of the package, being symmetrical according to symmetry planes 92, 90 of the package body 86. The first row 94 may be transformable into the second row 96 by mirroring the first row along symmetry plane 92 and the third row 98 may be transformable into the fourth row 100 by mirroring the third row along symmetry plane 90.

Referring now to FIG. 8, a schematic diagram of a three-dimensional representation of a cross-sectional view of the assembly of FIG. 7 taken along line II-II in FIG. 7, at different resonant modes is shown.

The first part 110 of the diagram shown in FIG. 8 provides a cross-sectional view of the package assembly without being subject to vibration close to a resonant frequency of the package body. The shown example package assembly may be based on a package assembly according to the example shown in FIG. 3, having a pitch of 0.8 mm, a lead width of 0.4 mm. The shown package encapsulates two electronic circuits 106, 108 and may for example be free from stress due to vibration energy received.

The second part 112 of the diagram shows the same view, but with the package assembly being stressed due to receiving a stimulation close to a first resonant mode (or resonant frequency) of the shown example package body. This may for example be about 20.6 kHz, which may be a rocking mode of the housing, i.e. the package body, especially due to side bending of the short side leads (not shown). In the shown example, the shown leads 84, 88, which are long side leads of first 94 and second row 96 are also bended. When comparing this to the example standard package shown in FIG. 3, increased rigidity of the package due to usage of ribbon leads 84 may increase first resonant frequency from 18.3 kHz without ribbon leads 84.

The third part 114 of the diagram shown in FIG. 8 again shows the same fraction of the package body, now at a second resonant mode, which may be about 21 kHz for the shown example, causing stress to bottom 118 and top 119 of the package body. However, second resonant frequency may be increased from for example 20 kHz compared to the example shown in FIG. 3, causing less distortion to the package and reduced lead bending.

The fourth part 116 of the diagram shown in FIG. 8 shows the assembly fraction at a third resonant mode of the package body, which may be about 24.8 kHz with the chosen example geometrical parameters as described above, distorting the package and bending for example the long side leads.

Further increase of the package natural resonant frequency may be achieved for example by adding additional ribbon leads in the corners of the package. Each of the first plurality of leads may be connected to corners of the package body and may have the first geometrical shape different from the second geometrical shape.

Resonance of the package may for example be relevant for devices having a certain operation frequency range. Tuning package rigidity by applying appropriate lead geometry may ensure having an offset between operation frequency and resonant frequency of the package. As an example, the electronic device 106, 108 may comprise at least one sensor element, for example an inertial sensor element, such as an accelerometer, an angular rate sensor, a gyroscope, or any combo-sensor. Accuracy of sensing may be reduced by additional vibrations of the sensing device caused for example by vibrations of the package body. A transducer sensor element, e.g. of an accelerometer, may have an operating frequency, and the systematic tuning of the package natural resonant frequency may allow to have a required offset from the transducer element operating frequency.

The package body may for example be a pre-molded cavity package body. The electronic device, e.g. a sensor device that may otherwise be stressed by a molding procedure, may be placed in the cavity. However, the package may also be an overmolded package.

The described principle of tuning a package natural resonant frequency may be applied to any device packages and mounting technologies. It may for example apply to through hole mounted modules. And the package assembly may be a surface mounted device (SMD). SMD lead shapes and size of contact area of a lead to a PCB may allow for easily influencing the rigidity of the package assembly by only small modifications, such as increasing the lead width. This may for example apply to gull-wing shaped leads, which extend slightly out, down and then out again. Therefore, the first and second plurality of package leads may be gull-wing shaped. However, other lead shapes, such as J-leads may be applied.

The package assembly may be any package assembly where symmetrical lead modification may be applied for achieving tuned balanced resonance behaviour of the package body while allowing for a uniform solder attach operation. Therefore, the package assembly may for example be a quad-flat package (QFP) assembly or a small outline package (SOP) assembly. It may also for example be a dual inline (DIL) package.

Figure 9:
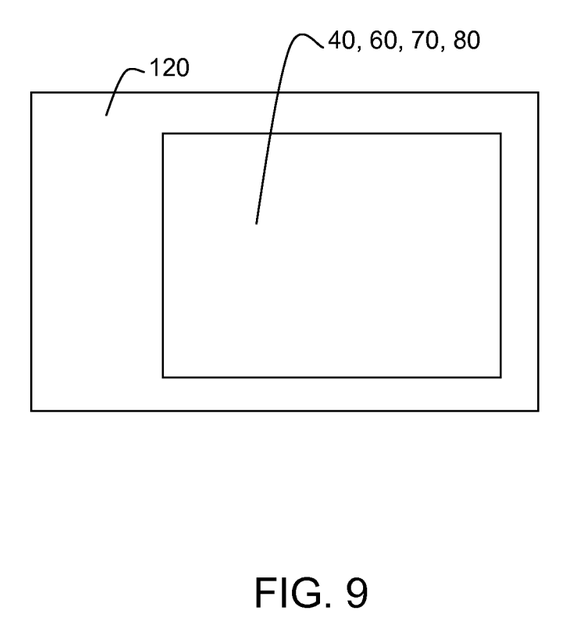
FIG. 9 shows a schematic diagram of an example of a sensor system.

Referring now also to FIG. 9, a schematic diagram of an example of a sensor system 120 is illustrated, comprising a package assembly 40, 60, 70, 80 as described above. A sensor system may be any system using one or more sensors and comprising at least one electronic device provided with a package assembly as described above.

Figure 10:
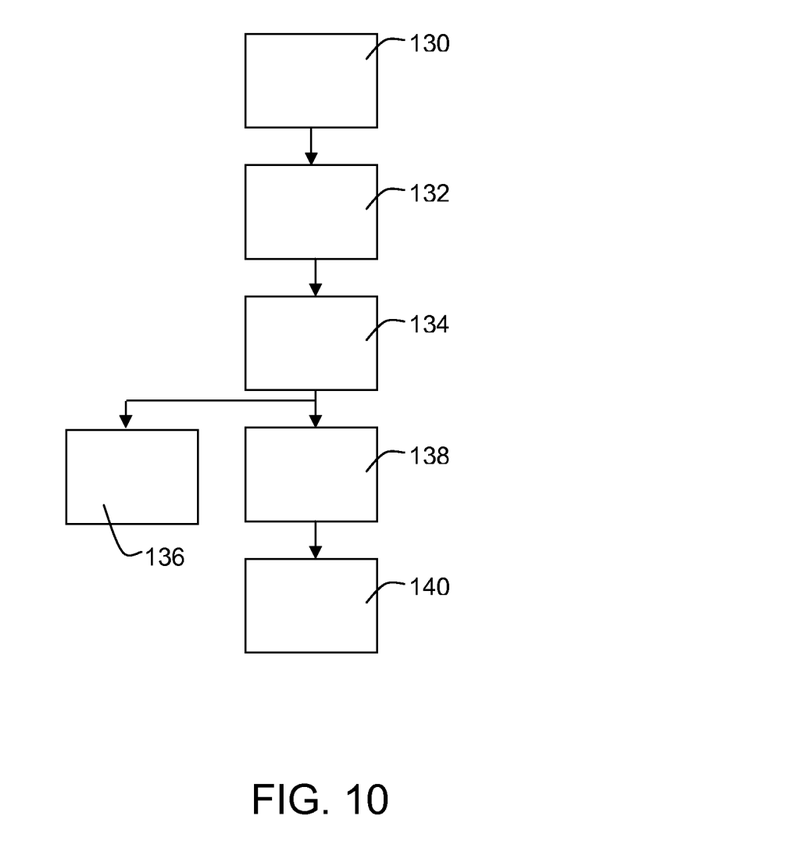
FIG. 10 shows a schematic flow diagram of an example of an embodiment of a method of tuning a natural resonant frequency of a package.

Referring now to FIG. 10, a schematic flow diagram of an example of an embodiment of a method of tuning a natural resonant frequency of a package is illustrated. The illustrated method allows implementing the advantages and characteristics of the described package assembly as part of a method of tuning a natural resonant frequency of a package.

The method of tuning a natural resonant frequency of a package may comprise providing 130 an electronic device; providing 132 a package body; providing 134 at least a first plurality of leads having a first geometrical shape and a second plurality of leads having a second geometrical shape, protruding from said package body. And the method may comprise locating 136 each of the first plurality of leads being in corners of the package body; or/and providing 138 each of the first plurality of leads having the first geometrical shape different from the second geometrical shape, and arranging 140 the first and the second plurality of leads in at least a first row and a second row located in parallel to the first row; with each of the rows comprising at least two leads; the first row being transformable into the second row by mirroring the first row along a symmetry plane of the package body.

In the foregoing specification, the invention has been described with reference to specific examples of embodiments of the invention. It will, however, be evident that various modifications and changes may be made therein without departing from the broader spirit and scope of the invention as set forth in the appended claims. For example, the leads may be any type of leads suitable to attach a package assembly to a carrier. Accordingly, unless implied or stated otherwise the leads may for example be direct or indirect connections to the carrier.

Because the package assembly implementing the present invention is based on packages known to those skilled in the art, package assembly details will not be explained in any greater extent than that considered necessary as illustrated above, for the understanding and appreciation of the underlying concepts of the present invention and in order not to obfuscate or distract from the teachings of the present invention.

Furthermore, the package assembly and leads may be implemented in a different manner than shown in the examples.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A package assembly, comprising:
    an electronic device;
    a package body;
    at least a first plurality of leads having a first geometrical shape and a second plurality of leads having a second geometrical shape, protruding from said package body;
    said first and said second plurality of leads arranged in at least a first row and a second row located in parallel to said first row; each of said rows comprising at least two leads;
    said first row being transformable into said second row by mirroring said first row along a symmetry plane of said package body;
    each of said first plurality of leads having said first geometrical shape different from said second geometrical shape; and
    wherein a width of each of said first plurality of leads differs from a width of each of said second plurality of leads, wherein said width of each of said first plurality of leads is a sum of n times said width of one of said second plurality of leads plus (n−1) times a pitch between two neighboring leads of said second plurality of leads, n being an integer number.

2. The package assembly as claimed in claim 1, wherein said electronic device is a semiconductor device.

3. The package assembly as claimed in claim 1, wherein said first geometrical shape differs from said second geometrical shape only in one of three spatial directions being orthogonal to each other.

4. The package assembly as claimed in claim 1, comprising a third plurality of leads having a third geometrical shape different from said first geometrical shape and said second geometrical shape.

5. The package assembly as claimed in claim 1, wherein said electronic device comprises at least one sensor element.

6. The package assembly as claimed in claim 1, wherein said package body is a pre-molded cavity package body.

7. The package assembly as claimed in claim 1, wherein said package assembly is a surface mounted device (SMD).

8. The package assembly as claimed in claim 1, wherein said first and second plurality of package leads are gull-wing shaped.

9. The package assembly as claimed in claim 1, wherein said package assembly is a quad-flat package (QFP) assembly or a small outline package (SOP) assembly.

10. A sensor system, comprising a package assembly as claimed in claim 1.

11. The package assembly as claimed in claim 3, comprising a third plurality of leads having a third geometrical shape different from said first geometrical shape and said second geometrical shape.

12. The package assembly as claimed in claim 3, wherein said electronic device comprises at least one sensor element.

13. A method of tuning a natural resonant frequency of a package, comprising:
- providing an electronic device;
- providing a package body;
- providing at least a first plurality of leads having a first geometrical shape and a second plurality of leads having a second geometrical shape, protruding from said package body;
- providing each of said first plurality of leads having said first geometrical shape different from said second geometrical shape;
- arranging said first and said second plurality of leads in at least a first row and a second row located in parallel to said first row; each of said rows comprising at least two leads; said first row being transformable into said second row by mirroring said first row along a symmetry plane of said package body; and
- wherein a width of each of said first plurality of leads differs from a width of each of said second plurality of leads, wherein said width of each of said first plurality of leads is a sum of n times said width of one of said second plurality of leads plus (n−1) times a pitch between two neighboring leads of said second plurality of leads, n being an integer number.

* * * * *